United States Patent [19]

Shearer et al.

[11] 4,236,110
[45] Nov. 25, 1980

[54] DIGITAL FREQUENCY DEVIATION METER

[75] Inventors: Harry D. Shearer; Robert E. Fowler, both of St. Petersburg, Fla.

[73] Assignee: E-Systems, Inc., Dallas, Tex.

[21] Appl. No.: 920,533

[22] Filed: Jun. 29, 1978

[51] Int. Cl.³ .......................................... G01R 23/02
[52] U.S. Cl. ............................... 324/78 Z; 324/79 R
[58] Field of Search ............... 324/76 R, 77 B, 77 A, 324/78 R, 78 Z, 79 R

[56] References Cited

U.S. PATENT DOCUMENTS

| | | | |
|---|---|---|---|
| 4,122,391 | 10/1978 | Harp | 324/79 R |
| 4,123,704 | 10/1978 | Johnson | 324/78 Z |

Primary Examiner—Michael J. Tokar
Attorney, Agent, or Firm—Robert V. Wilder; Albert M. Crowder, Jr.

[57] ABSTRACT

A digital frequency deviation meter for measuring the deviation of an FM signal from a center frequency is disclosed. An incoming FM signal is applied to a counter which is cycled through a series of sequential nonambiguous cyclical states. A storage memory, actuated at a center frequency produced by a timer, is provided for storing information about the present and immediately preceding sampled states of the counter. Operating synchronously with the timer is a detector that responds to the differences in magnitude and direction between the present and immediately preceding sampled states of the counter and generates a pulse when a state difference is detected. A frequency counter counts the pulses which are output at a rate proportional to the frequency deviation. To maintain the timer at center frequency a phase lock loop is provided.

11 Claims, 1 Drawing Figure

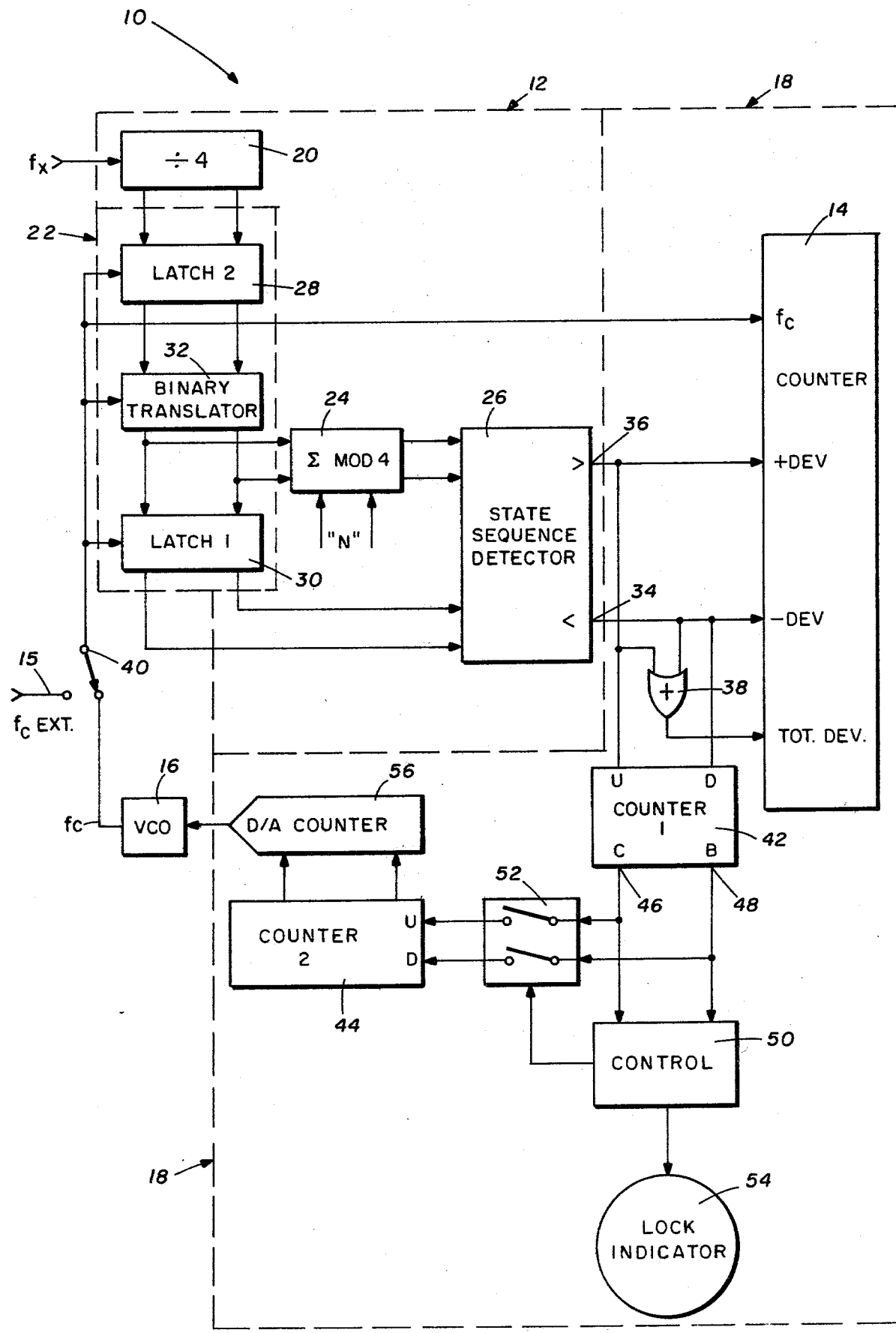

DIGITAL FREQUENCY DEVIATION METER

BACKGROUND OF THE INVENTION

1. Field of the Invention

The invention relates to frequency deviation meters and more particularly to frequency deviation meters with improved stability and resolution.

2. Description of the Prior Art

There is no known method for monitoring frequency deviations by direct counting processes. Known methods indirectly measure frequency deviations by beat note nulling then counting the beat oscillator, by using equivalent calibrated FM counters with analog discriminator output or by using high frequency reference interval counting and time gated counters.

Such systems, while useful in many applications, lack the stability and degree of resolution sometimes required. Accordingly, there is a need for highly stable digital deviation meters with high resolution.

SUMMARY OF THE INVENTION

The present invention provides a frequency deviation meter with improved resolution and stability.

In accordance with one embodiment of the invention, a digital frequency deviation meter is provided for measuring frequency deviations of an incoming FM signal from a center frequency. Counting means having sequential nonambiguous cyclical states is cycled in response to the frequency of the incoming signal. Storage means, actuated at a center frequency by a reference signal generated by timing means, is provided for storing information about the present and immediately preceding sampled states of the counting means. Detection means, operated synchronously with the timing means, detects differences in magnitude and direction between the present and immediately preceding sampled states of the counting means and generates a pulse when a state difference is detected. Frequency counting means counts the pulses which are output at a rate proportional to the magnitude of the frequency deviation.

DESCRIPTION OF THE DRAWINGS

For a more complete understanding of the present invention and advantages thereof, reference is now made to the following description taken in conjunction with the accompanying drawing in which:

FIG. 1 is a block diagram illustrating the preferred embodiment of the frequency deviation meter.

DESCRIPTION OF THE PREFERRED EMBODIMENT

In the preferred embodiment disclosed herein, a frequency deviation meter designated generally by the numeral 10 measures deviations in the frequency of an incoming signal from a center frequency $f_c$. Frequency deviation meter 10 includes an innovative high resolution, highly stable frequency discriminator circuit 12, which is the subject of a copending application filed concurrently herewith entitled, "Wide Band Digital Frequency Discriminator and Phase Frequency Detector", filed May 15, 1978, Ser. No. 906,030. The discriminator circuit 12 generates a pulse sequence at a rate directly proportional to the frequency deviation, $\Delta f$.

A conventional frequency counter 14 coupled to the discriminator circuit 12 counts the pulses to provide a measure of the frequency deviation. A reference signal of center frequency $f_c$ is supplied to the system from either an external frequency source 15 or from an internal voltage controlled oscillator 16. Oscillator 16 is maintained at the desired center frequency $f_c$ by a phase lock loop 18 described below in greater detail.

Operation of the discriminator circuit 12 is based on running a cyclical counter 20 at frequency $f_x$, intermittently sampling the instantaneous states of the counter 20 at frequency $f_c$ and comparing the present and immediately preceding sampled states of the counter 20 to discern the magnitude and direction of state changes caused by the build up of a cumulative slip error between $f_x$ and $f_c$. As state differences are detected, the discriminator circuit 12 generates a pulse sequence which is counted by the frequency counter 14.

Referring to the discriminator portion of the circuit 12 of FIG. 1, there is shown a counter 20, a storage circuit 22, a sum modulo-four adder 24 and a state sequence change detector 26, all connected in series. The information flow between successive elements is indicated by arrows, each arrow representing the transmission of one "bit" of information. Two arrows between successive elements of discriminator circuit 12 indicate the transfer of the two "bits" of information required to specify the four nonambiguous states of counter 20, as discussed below.

An incoming square wave or pulse signal of frequency $f_x$ is applied to the counter 20. Counter 20 may be any cyclical counter having a finite number of states which satisfies the criteria that the consecutive states do not differ by more than a single bit and that the states are nonambiguous so that the direction of change between consecutive states is discernible. The simplest circuit satisfying these criteria is the Johnson divide-by-four counter. This circuit is a two stage linear counter having two serially connected stages A and B, in which the inverse of second stage B is input to the first stage A so that the counter cycles through four states, 0, 1, 2 and 3. States 0, 1, 2 and 3 are represented by the Johnson Code generated by counter 20, given by the truth table:

TABLE 1

| State | Counter Output B | A | Uncoded Binary | |
| --- | --- | --- | --- | --- |
| 0 | 0 | 0 | 0 | 0 |
| 1 | 1 | 0 | 0 | 1 |
| 2 | 1 | 1 | 1 | 0 |
| 3 | 0 | 1 | 1 | 1 |

As evident from the truth table, consecutive states of the Johnson counter differ by only a single bit. If any two consecutive states are known, it is possible to ascertain the direction of change.

Johnson divide-by-four counter 20 may be constructed by connecting two J-K or two D flip-flops in series, inverting the output of the second flip-flop and returning it as the input to the first. Further details concerning Johnson ring counters and their construction may be found, for example, in Malvino and Leach, Digital Principles and Applications, pp. 219-221 (McGraw-Hill, 1969).

Although a four state Johnson counter is preferred because it provides the simplest implementation of counter 20, it will be understood that other counters satisfying the above criteria may also be used, as for example, counters having more than four states or counters generating other codes, such as the Gray Code.

Information about the state of counter 20 is obtained and stored in storage circuit 22, which stores the present and immediately preceding sampled states of counter 20 for later comparison by the state sequence change detector 26. Storage circuit 22 contains two latches 28 and 30 each capable of storing two bits of information and retaining respectively, coded information representative of the present and immediately preceding sampled states of counter 20. Depending upon the particular application, latches 28 and 30 may be implemented by a pair of flip-flops in a shift register or dual J-K or D flip-flops clocked at $f_c$. Latch 28 is updated by sampling the present state of counter 20 at frequency $f_c$. Latch 30 is simultaneously updated by sampling information about the immediately preceding sampled state of counter 20 currently stored in latch 28.

Information about the present and immediately preceding state of counter 20 is input to a state sequence change detector 26 where is it processed to discern state changes which have built up between consecutive samplings. Because the information about the states of counter 20 may be coded, as for example in Johnson Code, state sequence change detector 26 must either have code compatible logic for processing information input in code or, alternatively, the coded information must be translated into a form compatible with the logic of the detector.

In the preferred embodiment, information about the states of counter 20 is transformed from Johnson Code into a binary coded sequence, which renders it into a form reducible by a conventional four-bit full adder employed in the state sequence change detector 26. Before the state information stored in latch 28 is output to latch 30 or to state sequence change detector 26, it is passed through a binary translator 32 which translates state information in Johnson Code into the binary coded sequence. Binary translator 32 may be implemented by available integrated circuits, such as a quad two input NAND gate, TTL7400 manufactured by Texas Instruments which can be used to generate the uncoded entries of Truth Table 1.

Operation of the discriminator is based on the build up of state differences between consecutive sampling of the divide-by-four counter 20 operating on $f_x$. When the frequency of the incoming signal is equal to the center frequency, $f_x = f_c$, the recurrent update of latches 28 and 30 at $f_c$ will continually sample the same recurrent state of the counter 20 so that the information in latches 28 and 30 will be the same and no state change will be detected by state sequence change detector 26.

When the frequency of the incoming signal is less than the center frequency, $f_x < f_c$, the incoming signal will drive the counter 20 at a rate which is nonsynchronous with sampling by storage circuit 22. Eventually, the difference in the frequency at which the counter is driven and the frequency of sampling will cause a single state difference between latches 28 and 30 which will be detected by state sequence change detector 26. Depending upon the direction of the state change, a pulse will be output at the "less than" port 34 or "greater than" port 36 of detector 26.

Since the counter 20 when implemented is a Johnson counter, it has four cyclical states, 0,1,2,3; 0,1,2,3, etc., the possible states of latches 28 and 30 at the time of a single state difference are:

TABLE 2

| Latch 28 (Present State) | Latch 30 (Immediately Preceding State) |
| --- | --- |
| 0 | 3 |
| 1 | 0 |
| 2 | 1 |
| 3 | 2 |

Detection of any of these increasing state changes by the state sequence detector produces a pulse on the "less than" port 34 of detector 26.

When the frequency of the incoming signal $f_x$ exceeds the frequency of the center frequency $f_c$, the frequency deviation will eventually cause a single state difference to build up between latches 28 and 30 in the opposite direction. The states for latches 28 and 30 at the time a single state difference has occurred will be:

TABLE 3

| Latch 28 (Present State) | Latch 30 (Immediately Preceding State) |
| --- | --- |
| 0 | 1 |
| 1 | 2 |
| 2 | 3 |
| 3 | 0 |

Detection of any of these decreasing state differences produces a pulse on the "greater than" port 36 of detector 26.

Since the state sequence change detector 26 is capable of detecting only single bit changes between the preceding and present sampled states of counter 20, frequency deviations in excess of $f_c/4$ will result in more than a single state change and cannot be resolved by the state sequence change detector 26. This limitation is overcome and the range of measurable frequency deviation extended beyond $\pm f_c/4$ by introducing a state change correction factor to advance the state stored in latch 28 so that only a single state difference between the present and immediately past sampled states is encountered by detector 26.

The correction factor is applied to the information stored in latch 28 prior to processing by detector 26 by adding the correction factor in the sum modulo-four adder 24 with the binary coded sequence input from binary translator 32. The correction factor, indicated in the block diagram by the arrows labeled "N" is a particular binary sequence summed into the counter, the choice of which depends upon the desired bandwidth. For example, an error correction factor of "1" advances the present state of the counter 20 by one; an error correction factor of "2" advances the present state of the counter 20 by two states. Details concerning particular choices of "N" and the discriminator transfer functions obtained may be found in the copending application referred to above. Modulo-four adder 24 may be implemented by conventional integrated circuitry, such as a four-bit full adder TTL7483 or a two-bit full adder TTL7482, manufactured by Texas Instruments, in which the carry operation is ignored to permit modular arithmetic.

The information output from sum modulo-four adder 24 and from latch 30 is input into state sequence change detector 26 which outputs a pulse at port 34 or 36 when detector 26 recognizes a single bit difference between the inputs from modulo-four adder 24 and latch 30. Any logic capable of discerning the magnitude and direction of state changes and generating Truth Tables 2 and 3 above may be used. For example, in some applications, 4-bit full adder such as TTL7483 manufactured by Texas Instruments will be suitable.

The rate of slip represented by pulses output at the "greater than" and "less than" ports 34 and 36 of detector 26 is proportional to the absolute value of the frequency deviation. It is therefore possible to count directly the positive deviations from port 36, negative deviations from port 34 or the total positive and negative deviations obtained by passing the output of ports 34 and 36 through an OR gate 38.

A conventional frequency counter accepts positive deviation signals, negative deviation signals or total positive and negative deviation signals input from OR gate 38. Any conventional frequency counter 14 such as the Mod 5381A, manufactured by Hewlett-Packard would be suitable in many applications.

A switch 40 enables the user to select a reference signal of frequency $f_c$ from external frequency source 15 or internally from the voltage control oscillator 16. Where the signal is internally supplied, a phase lock loop 18 is included in the circuit to search for and correct any drift of the reference signal from $f_c$. In this mode, the phase lock loop 18 searches out the mean value of $f_x$ and, if a one-sided error in excess of a predetermined level is detected, adjusts the control voltage of the oscillator 16 to restore the reference signal to center frequency.

Referring now to the phase lock loop 18 in greater detail, two counters 42 and 44 perform the primary functions of the loop 18. Counter 42 is an up-down counter to which is input the signal from the "less than" and "greater than" ports 34 and 36 of the state sequence change detector 26. Counter 42 counts up in response to a pulse from "greater than" port 36 and counts down in response to a pulse from "less than" port 34. If the frequency of the reference signal has drifted from $f_c$, unidirectional errors will eventually build up in the counter 42 which exceed the band of allowable error and will spill over via the carry or borrow ports 46 and 48 to a switch control 50. When the switch control 50 receives a pulse from port 46 or 48, it closes a switch 52 completing a phase lock loop so that the oscillator signal can be restored to center frequency as will be explained. Up-down counter 42 is available as an integrated circuit such as TTL74191 or TTL74192, manufactured by Texas Instruments. Switch control 50 may be, for example, a retriggerable monostable multivibrator such as TTL74123, manufactured by Texas Instruments connected to an ancillary circuit or to a relay to close switch 52.

Closure of switch 52 and completion of loop 18 permits the output of carry and borrow ports 46 and 48 to be averaged by the second counter 44 to provide a signal to the voltage controlled oscillator 16 to bring the oscillator signal back onto center frequency. Switch control 50 may also operate a lock indicator 54 such as a light using, for example, a monostable multivibrator with a driver to indicate when the oscillator signal is locked onto center frequency.

The up-down counter 44 cooperates with a digital-to-analog converter 56 to take the long term average of the excursions from carry and borrow ports 46 and 48 of counter 42 to provide an analog signal which is then sent to the voltage controlled oscillator 16 to pull the oscillator signal back into center frequency. The pulses from ports 46 and 48 are algebraically counted by up-down counter 44 which produces step function output representative of the average frequency drift. The step function output is then smoothed by converter 56 to provide a smooth feedback signal for voltage controlled oscillator 16. Up-down counter 44 may be implemented by an integrated circuit such as TTL74191 or TTL74192, manufactured by Texas Instruments. The digital-to-analog converter 56 may be a chip such as an AMD100, manufactured by Analog Devices.

Thus, by using the high resolution discriminator in cooperation with a conventional frequency counter, frequency deviation is directly measured to a high degree of accuracy.

Although particular embodiments of the invention have been described herein, it will be understood that the invention is not limited to the embodiments disclosed, but is capable of rearrangement, modification and substitution of parts and elements without departing from the spirit and scope of the invention.

What is claimed is:

1. A digital frequency deviation meter for measuring the frequency deviations of an incoming FM signal from a center frequency, the combination comprising:
   timing means for producing a reference signal of center frequency;
   counting means responsive to the frequency of the incoming signal by cycling through a series of nonambiguous cyclical sequential states;
   storage means actuated at center frequency for storing information about the present and immediately preceding sampled states of said counting means;
   detection means actuated at center frequency for detecting changes in magnitude and direction between consecutive sampled states, said means generating a pulse when a state change is detected; and
   frequency counting means connected to said detection means for counting said pulses.

2. The combination of claim 1 further comprising:
   means for monitoring frequency deviations to determine if the reference signal has drifted from center frequency.

3. The combination of claim 2 further comprising:
   control means responsive to drift of the reference signal from center frequency, said control means correcting said timing means to cause the reference signal to return to center frequency.

4. The combination of claim 1 further comprising:
   means for indicating when said reference signal is at center frequency.

5. The combination of claim 1 wherein said counting means includes a Johnsom divide-by-four counter.

6. The combination of claim 1 wherein said storage means includes:
   a first latch actuated at center frequency for sampling the present state of said counting means; and
   a second latch actuated at center frequency for sampling the state of said first latch to obtain the immediately preceding sampled state of said counting means.

7. A digital frequency deviation meter for measuring the frequency deviations of an incoming FM signal from center frequency, the combination comprising:
   timing means for producing a reference signal of center frequency;
   a Johnson divide-by-K counter responsive to the frequency of the incoming signal and cycling through K sequential, nonambiguous, cyclical states;

first and second latches for storing information about the present and immediately preceding sampled states of said counter, said first latch actuated at center frequency for sampling the present state of said Johnson counter, said second latch also attached at center frequency for sampling the state of said first latch to obtain the immediately preceeding sampled state of said counter;

means for translating information about the sampled states of said Johnson counter into a binary coded sequence;

means for adding a binary sequence is translated information from said first latch to advance the apparent state of said counter a predetermined number of states;

detection means actuated at center frequency for detecting changes in magnitude and direction between consecutive sampled states, said means having "greater than" and "less than" output ports and generating a pulse at said "greater than" port when a decreasing state change is detected and a pulse at said "less than" port when an increasing state change is detected; and a frequency counter for counting the pulses generated by said detection means.

8. The combination of claim 7, further comprising:

first counting means having carry and borrow output ports for algebraically counting pulses from said "less than" port and pulses from said "greater than" port, said means generating a pulse at said carry port when the counting means reaches a predetermined positive count and generating a pulse at said borrow port when the counting means reaches a predetermined negative count;

integrating means, selectively connected to said counting means, for time integrating the pulses output at either of said 10 carry or borrow ports; and switching means disposed between said counting means and said integrating means, said switching means connecting said counting means to said integrating means when a pulse is detected at the carry or borrow ports of said first counting means and for disconnecting said first 15 counting means from said integrating means when no pulse is detected at said carry or borrow ports.

9. The combination of claim 8 wherein said integrating means includes:

second counting means for algebraically counting pulses from the borrow port and positive from the carry port of said first counting means; and conversion means for converting the output of said second counting means to an analog voltage.

10. A digitial frequency deviation meter for measuring the frequency deviation of an incoming FM signal from a center frequency, the combination comprising:

timing means for producing a reference signal of center frequency;

a Johnson divide-by-four counter responsive to the frequency of the incoming signal and cycled through four nonambiguous, cyclical, sequential states;

first and second latches for storing information representative of the present and immediately preceding sampled states of said Johnson counter, said first latch actuated at center frequency for sampling the present state of said Johnson counter, said second latch also actuated at center frequency for sampling the state of said first latch to obtain the immediately preceding state of said counter;

a binary translator for translating information about the present and immediately preceding sampled states of said Johnson counter into a binary coded sequence;

a sum modulo-four adder counter for adding a binary sequence to translated information from said first latch to advance the apparent state of said counter a predetermined number of states;

detection means actuated at center frequency for detecting changes in magnitude and direction between consecutive sampled states, said means having "greater than" and "less than" output ports, and generating a pulse at said "greater than" port when a decreasing state change is detected and a pulse at said "less than" port when an increasing state change is detected; and a frequency counter for counting frequency deviations of said incoming signals from said center frequency.

11. A method for measuring frequency deviations of an FM signal from a center frequency comprising the steps of:

cycling a counter responsive to the frequency of the incoming FM signal through a series of sequential, nonambiguous, cyclical states;

updating at center frequency a first latch by sampling information about the instantaneous state of the counter;

simultaneously updating at center frequency a second latch by sampling information stored in the first latch about the immediately preceding sampled state of the counter;

comparing information in the first and the second latches to discern a single state difference between information stored in the first and the second latches;

if a single state difference is discerned, generating an output pulse corresponding to the direction of the state change; and counting the frequency of the output pulses to determine the frequency deviation of the incoming signal from center frequency.

* * * * *